(12) United States Patent
Chen et al.

(10) Patent No.: US 10,276,578 B2
(45) Date of Patent: Apr. 30, 2019

(54) DYNAMIC OXIDE SEMICONDUCTOR RANDOM ACCESS MEMORY(DOSRAM) HAVING A CAPACITOR ELECTRICALLY CONNECTED TO THE RANDOM ACCESS MEMORY (SRAM)

(71) Applicant: UNITED MICROELECTRONICS CORP., Hsin-Chu (TW)

(72) Inventors: Hsin-Wen Chen, Kaohsiung (TW); Chi-Chang Shuai, Hsinchu (TW); Hsien-Hung Tsai, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/632,378

(22) Filed: Jun. 25, 2017

(65) Prior Publication Data
US 2018/0374856 A1    Dec. 27, 2018

(51) Int. Cl.
| H01L 27/108 | (2006.01) |
| H01L 27/11  | (2006.01) |
| H01L 29/24  | (2006.01) |

(52) U.S. Cl.
CPC .... *H01L 27/10897* (2013.01); *H01L 27/1104* (2013.01); *H01L 27/1116* (2013.01); *H01L 29/24* (2013.01)

(58) Field of Classification Search
CPC ........... H01L 27/10897; H01L 27/1104; H01L 27/1116; H01L 29/24
USPC ........................................................ 365/154
See application file for complete search history.

(56) References Cited

U.S. PATENT DOCUMENTS

| 9,385,713 B2* | 7/2016 | Uesugi ................. H01L 27/1207 |
| 2005/0162896 A1* | 7/2005 | Jung ........................ G11C 14/00 365/154 |
| 2008/0129195 A1* | 6/2008 | Ishizaki ................ H01L 27/322 313/504 |
| 2016/0094236 A1* | 3/2016 | Shionoiri .............. H03M 1/002 341/122 |
| 2017/0248128 A1* | 8/2017 | Koyama ................... F03G 7/08 |

(Continued)

OTHER PUBLICATIONS

Hsin Wen Chen et al., "OSSRAM 8T1C, 9T1C Cell Structure", Invention Disclosure, Jan. 10, 2017, p. 1-23.

(Continued)

*Primary Examiner* — Sung Il Cho
(74) *Attorney, Agent, or Firm* — Winston Hsu

(57) ABSTRACT

The present invention provides a semiconductor memory circuit, the semiconductor memory circuit includes a static random access memory (SRAM), having a first storage node and a second storage node, a dynamic oxide semiconductor random access memory (DOSRAM), electrically connected to the SRAM, wherein the DOSRAM includes a first oxide semiconductor field effect transistor (OSFET) and a capacitor, wherein a source of the first OSFET is electrically connected to the first storage node, and a drain of the first OSFET is electrically connected to the capacitor, and a second transistor and a third oxide semiconductor field effect transistor (OSFET), wherein a drain of the second transistor is electrically connected to the second storage node, a source of the third OSFET is electrically connected to the capacitor, and a drain of the third OSFET is electrically connected to a gate of the third transistor.

6 Claims, 5 Drawing Sheets

(56) References Cited

U.S. PATENT DOCUMENTS

| | | | |
|---|---|---|---|
| 2017/0323892 A1* | 11/2017 | Endo | H01L 27/10805 |
| 2017/0330873 A1* | 11/2017 | Tamura | H03K 19/0008 |
| 2018/0052508 A1* | 2/2018 | Okamoto | G06F 1/3275 |
| 2018/0061307 A1* | 3/2018 | Inoue | G09G 3/3275 |
| 2018/0061344 A1* | 3/2018 | Kurokawa | G09G 3/3233 |
| 2018/0075886 A1* | 3/2018 | Ishizu | G11C 7/12 |
| 2018/0082747 A1* | 3/2018 | Tamura | G11C 16/10 |
| 2018/0084314 A1* | 3/2018 | Koyama | G08C 17/02 |
| 2018/0090111 A1* | 3/2018 | Kozuma | G09G 3/2092 |
| 2018/0090616 A1* | 3/2018 | Nakagawa | H01L 27/28 |
| 2018/0096670 A1* | 4/2018 | Iwaki | G09G 3/2007 |
| 2018/0101359 A1* | 4/2018 | Harada | G06F 7/5443 |
| 2018/0114578 A1* | 4/2018 | Ishizu | G11C 11/401 |
| 2018/0166392 A1* | 6/2018 | Yamazaki | H01L 21/28 |

OTHER PUBLICATIONS

Tamura, Title of Periodical:"Embedded SRAM and Cortex-M0 Core with Backup Circuits Using a 60-nm Crystalline Oxide Semiconductor for Power Gating", 2014.

* cited by examiner

DYNAMIC OXIDE SEMICONDUCTOR RANDOM ACCESS MEMORY(DOSRAM) HAVING A CAPACITOR ELECTRICALLY CONNECTED TO THE RANDOM ACCESS MEMORY (SRAM)

BACKGROUND OF THE INVENTION

1. Field of the Invention

The present invention relates to a semiconductor memory device, in particular, to a semiconductor memory device with a static random access memory (SRAM) connecting to a dynamic oxide semiconductor random access memory (DOSRAM).

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

In order to reduce the power consumption of a semiconductor device, circuits that do not need to operate are stopped by power gating or clock gating. A flip-flop (FF) is a sequential circuit (storage circuit that holds a state) included a lot in a semiconductor device. Thus, a reduction in power consumption of the FF leads to a reduction in power consumption of a semiconductor device including the FF. When a general FF is powered off, a state (data) held therein is lost.

By taking advantage of extremely low off-state current of a transistor whose semiconductor region is formed using an oxide semiconductor (hereinafter, such a transistor may be referred to as an OS transistor), a retention circuit capable of retaining data even when powered off has been proposed.

SUMMARY OF THE INVENTION

The present invention provides a semiconductor memory circuit, the semiconductor memory circuit comprises a dynamic oxide semiconductor random access memory (DOSRAM), and the DOSRAM comprises a first oxide semiconductor field effect transistor (OSFET) and a capacitor, wherein a drain of the first OSFET is electrically connected to the capacitor, and a second transistor and a third oxide semiconductor field effect transistor (OSFET), wherein a source of the third OSFET is electrically connected to the capacitor, and a drain of the third OSFET is electrically connected to a gate of a second transistor.

The present invention provides a semiconductor memory circuit, the semiconductor memory circuit comprises a static random access memory (SRAM), having a first storage node and a second storage node, and a dynamic oxide semiconductor random access memory (DOSRAM), electrically connected to the SRAM, wherein the DOSRAM comprises a first oxide semiconductor field effect transistor (OSFET) and a capacitor, wherein a source of the first OSFET is electrically connected to the first storage node, and a drain of the first OSFET is electrically connected to the capacitor, and a second oxide semiconductor field effect transistor (OSFET), wherein a gate of the second OSFET is electrically connected to the capacitor, and a drain of the second OSFET is electrically connected to the second storage node.

The present invention provides a memory device which includes a SRAM connecting to a DOSRAM, and the data that is stored in the SRAM can be transferred into the DOSRAM. Afterwards, the SRAM can be turned off, thereby the power consumption of the memory device can be effectively reduced. By the applicant's experiment, after connecting the SRAM with a DOSRAM, the standby power of the memory device can be reduced from 2.9 µW to 0.003 µW. Besides, in order to cut off the leakage current from the capacitor while reading data from the DOSRAM, in some embodiments of the present invention, an additional OSFET is set between the capacitor and the gain cell transistor, thereby improving the accuracy of the memory device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
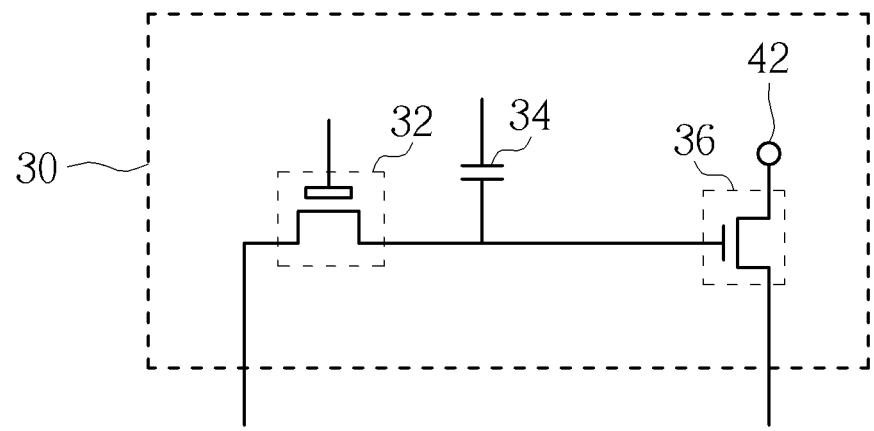
FIG. 1 illustrates a circuit diagram of a dynamic oxide semiconductor random access memory (DOSRAM) according to a first preferred embodiment of the present invention.
Figure 2:
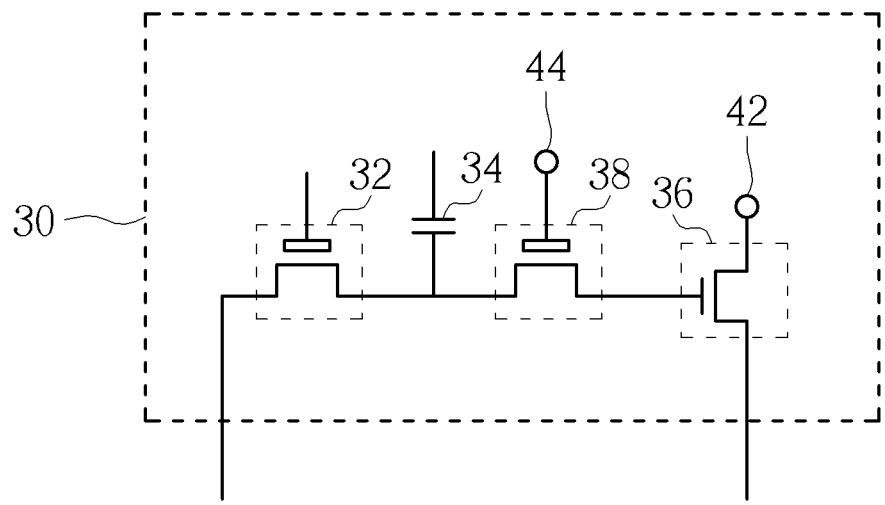
FIG. 2 illustrates a circuit diagram of a dynamic oxide semiconductor random access memory (DOSRAM) according to a first preferred embodiment of the present invention.

Referring to FIGS. 1-2, FIG. 1 illustrates a circuit diagram of a dynamic oxide semiconductor random access memory (DOSRAM) according to a first preferred embodiment of the present invention, FIG. 2 illustrates a circuit diagram of a dynamic oxide semiconductor random access memory (DOSRAM) according to a second preferred embodiment of the present invention.

In the first preferred embodiment of the present invention, at least one dynamic oxide semiconductor random access memory (hereinafter referred to as DOSRAM) 30 is provided, which consists of an oxide semiconductor field effect transistor (hereinafter referred to as OSFET) 32, a capacitor 34 and a gain cell transistor 36. In the present invention, the gain cell transistor 36 may be an NMOS transistor or a PMOS transistor, here takes an NMOS transistor as an example. Usually, the DOSRAM 30 will be electrically connected to a memory device (such as a SRAM), and the storage data of the SRAM can be transferred and stored in the capacitor 34 of the DOSRAM 30. The feature of the DOSRAM 30 is that the OSFET 32 of the DOSRAM 30 includes an oxide semiconductor layer, and the standby power of the DOSRAM is very low, so when the data is stored in the capacitor 34 of the DOSRAM 30, the memory device (such as the SRAM) can be turned off, and the power consumption of the whole device can be effectively reduced.

Besides, it is noteworthy that the signal (current) from the capacitor 34 is used to turn on or turn off the gate of the gain cell transistor 36, and a source of the gain cell transistor 36 is electrically acting to output a restore signal 42. Since the restore signal 42 is much larger than the original signal from the capacitor 34, the signal can be amplified, thereby improving the accuracy of the memory device.

However, one potential issue of the first embodiment mentioned above is that the leakage current from the capacitor 34 may flow to the gain cell transistor 36, and the data stored in the capacitor 34 may be discharged (or be erased).

In the second embodiment of the present invention, as shown in FIG. 2, the feature of this embodiment further comprises an OSFET 38 disposed between the capacitor 34 and the gate of the gain cell transistor 36. More precisely, a source of the OSFET 38 is electrically connected to the capacitor 34, and a drain of the OSFET 38 is electrically connected to the gate of the gain cell transistor 36. The purpose of forming the OSFET 38 is to "cut off" the leakage current from the capacitor 34 to the gain cell transistor 36. Since the leakage current of the OSFET 38 is very low, when the channel of the OSFET 38 is closed, the OSFET 38 can cut off (block) the leakage current from the capacitor 34 to the gain cell transistor 36 effectively. Therefore, the capacitor 34 will not be discharged easily, in other words, the data stored in the capacitor 34 will not be erased by the leakage current. Besides, the gate of the OSFET 38 is electrically connected to another restore signal 44, to determine whether the OSFET 38 is activated or deactivated.

The following description will detail the different embodiments of the semiconductor memory circuit of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 3:
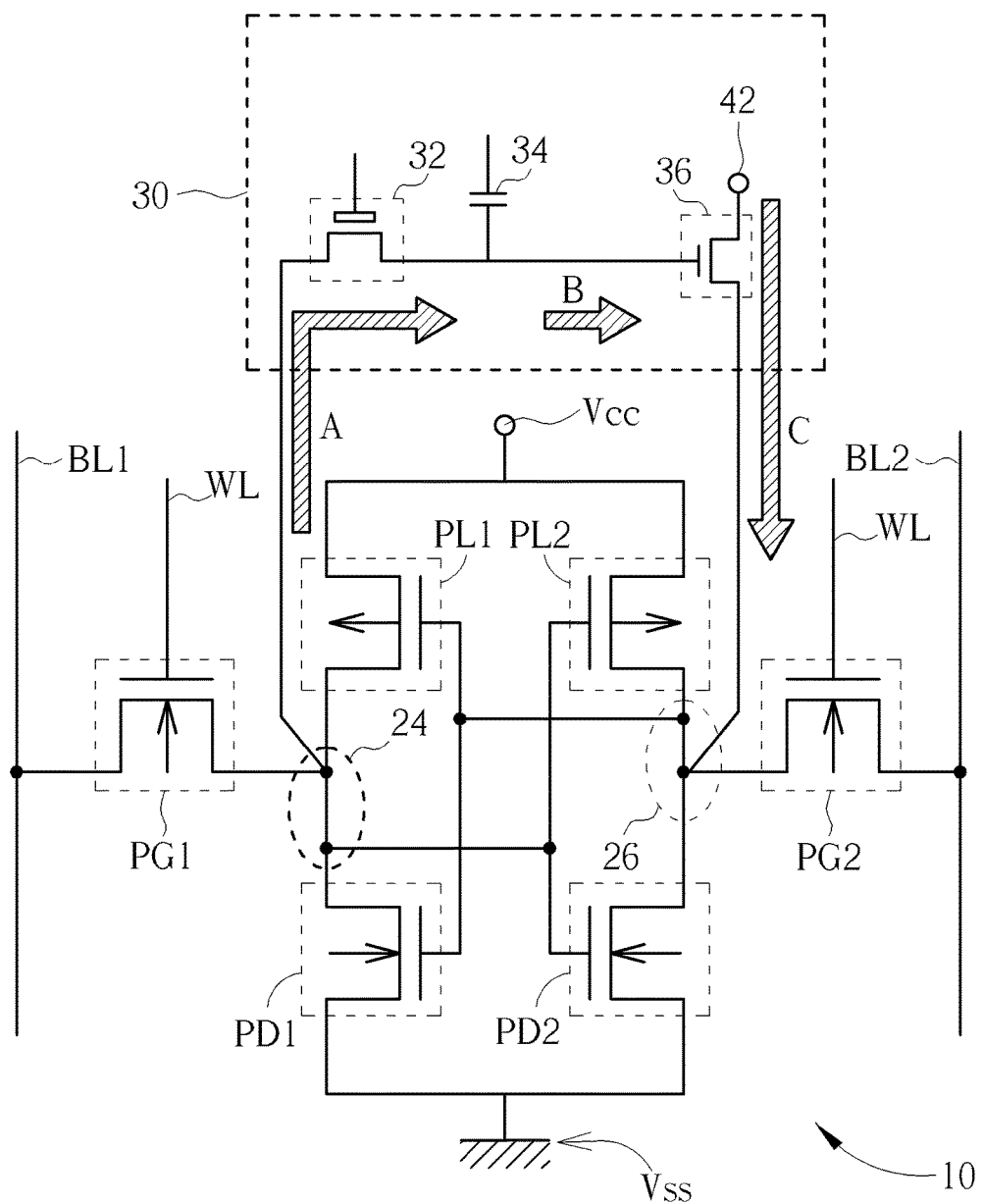
FIG. 3 illustrates a circuit diagram of a six-transistor SRAM (6T-SRAM) cell which is electrically connected to the dynamic oxide semiconductor random access memory (DOSRAM) according to a first preferred embodiment of the present invention.

Please refer to FIG. 3, FIG. 3 illustrates a circuit diagram of a six-transistor SRAM (6T-SRAM) cell which is electrically connected to the dynamic oxide semiconductor random access memory according to the first preferred embodiment of the present invention. However, the present invention is not limited to 6T-SRAM, in other embodiments of the present invention, the SRAM may be an 8T-SRAM, 10T-SRAM or other suitable memory devices.

In this embodiment, each 6T-SRAM cell 10 is composed of a first pull-up transistor PL1, a second pull-up transistor PL2, a first pull-down transistor PD1, a second pull-down transistor PD2, a first access transistor PG1 and a second access transistor PG2. These six devices (transistors) constitute a set of flip-flops. The first and the second pull-up transistors PL1 and PL2, and the first and the second pull-down transistors PD1 and PD2 constitute a latch circuit that stores data in the storage nodes 24 and 26. Since the first and the second pull-up transistors PL1 and PL2 act as power load devices, they can be replaced by resistors. Under this circumstance, the static random access memory becomes a four-transistor SRAM (4T-SRAM). In this embodiment, the first and the second pull-up transistors PL1 and PL2 preferably share a source/drain region and electrically connect to a voltage source (voltage node) Vcc, and the first and the second pull-down transistors PD1 and PD2 share a source/drain region and electrically connect to a voltage source (voltage node) Vss.

Preferably, the first and the second pull-up transistors PL1 and PL2 of the 6T-SRAM cell 10 are composed of p-type metal oxide semiconductor (PMOS) transistors; the first and the second pull-down transistors PD1 and PD2, the first access transistors PG1 and the second access transistors PG2 composed of n-type metal oxide semiconductor (NMOS) transistors, but not limited thereto. The first pull-up transistor PL1 and the first pull-down transistor PD1 constitute an inverter, which further form a series circuit. One end of the series circuit is connected to a voltage source Vcc and the other end of the series circuit is connected to a voltage source Vss. Similarly, the second pull-up transistor PL2 and the second pull-down transistor PD2 constitute another inverter and a series circuit. One end of the series circuit is connected to the voltage source Vcc and the other end of the series circuit is connected to the voltage source Vss. The two inverters are cross-coupled to each other to store data.

The storage node 24 is connected to the respective gates of the second pull-down transistor PD2 and the second pull-up transistor PL2. The storage node 24 is also connected to the drains of the first pull-down transistor PD1, the first pull-up transistor PL1 and the first access transistor PG1. Similarly, the storage node 26 is connected to the respective gates of the first pull-down transistor PD1 and first the pull-up transistor PL1. The storage node 26 is also connected to the drains of the second pull-down transistor PD2, the second pull-up transistor PL2 and the second access transistor PG2. The gates of the first access transistor PG1 and the second access transistor PG2 are respectively coupled to a word line (WL); the source of the first access transistor PG1 and the second access transistor PG2 are respectively coupled to a first bit line (BL1) and a second bit line (BL2).

In addition, in one embodiment of the present invention, both the storage node 24 and storage node 26 are electrically connected to the DOSRAM 30. More precisely, the storage node 24 is electrically connected to a source of the OSFET 32, and the storage node 26 is electrically connected to a drain of the gain cell transistor 36. The values that are stored in the storage node 24 and storage node 26 are complementary to each other (for example, if the value stored in the storage node 24 is 0, the value stored in the storage node 26 must be 1, and vice versa). Therefore, only one DOSRAM is needed to connect the storage node 24 (or the storage node 26), and the value that is stored in another storage node can still be known.

The value that is stored in the storage node 24 can be transferred to the capacitor 34 of the DOSRAM 30 passing through the path A. In other words, the value stored in the storage node 24 is written to the capacitor 34 of the DOSRAM 30. And when the 6T-SRAM cell 10 needs to read the value stored in the capacitor 34, the signal (current) is output from the capacitor 34, passing through the path B, and to the storage node 26. The capacitor 34 may be a metal-insulating-metal (MIM) structure. When the gate of the gain cell transistor 36 is turn on, the channel of the gain cell transistor 36 is opened, and the restore signal 42 can be transferred and passed through the channel of the gain cell transistor 36, to the storage node 26 (i.e. the path C shown in FIG. 3).

Figure 4:
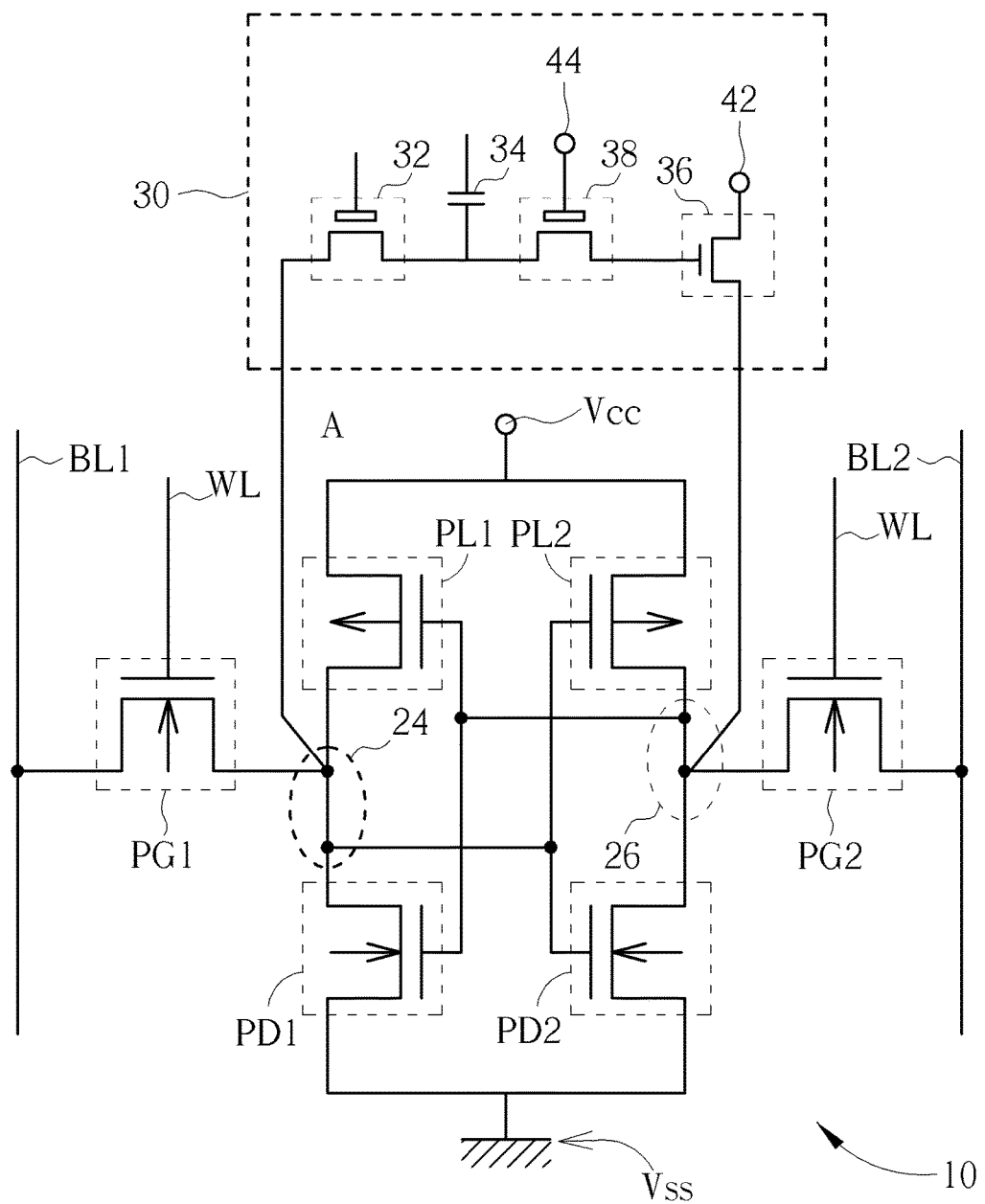
FIG. 4 illustrates a circuit diagram of a six-transistor SRAM (6T-SRAM) cell which is electrically connected to a dynamic oxide semiconductor random access memory (DOSRAM) according to a second preferred embodiment of the present invention.

Similarly, as shown in FIG. 4, FIG. 4 illustrates a circuit diagram of a six-transistor SRAM (6T-SRAM) cell which is electrically connected to the dynamic oxide semiconductor random access memory according to the second preferred embodiment of the present invention. In this embodiment, since the OSFET 38 is further set between the capacitor 34 and the gain cell transistor 38, the data stored in the capacitor 34 cannot be discharged easily by the leakage current of the gain cell transistor 36, thereby improving the accuracy of the memory device.

Figure 5:
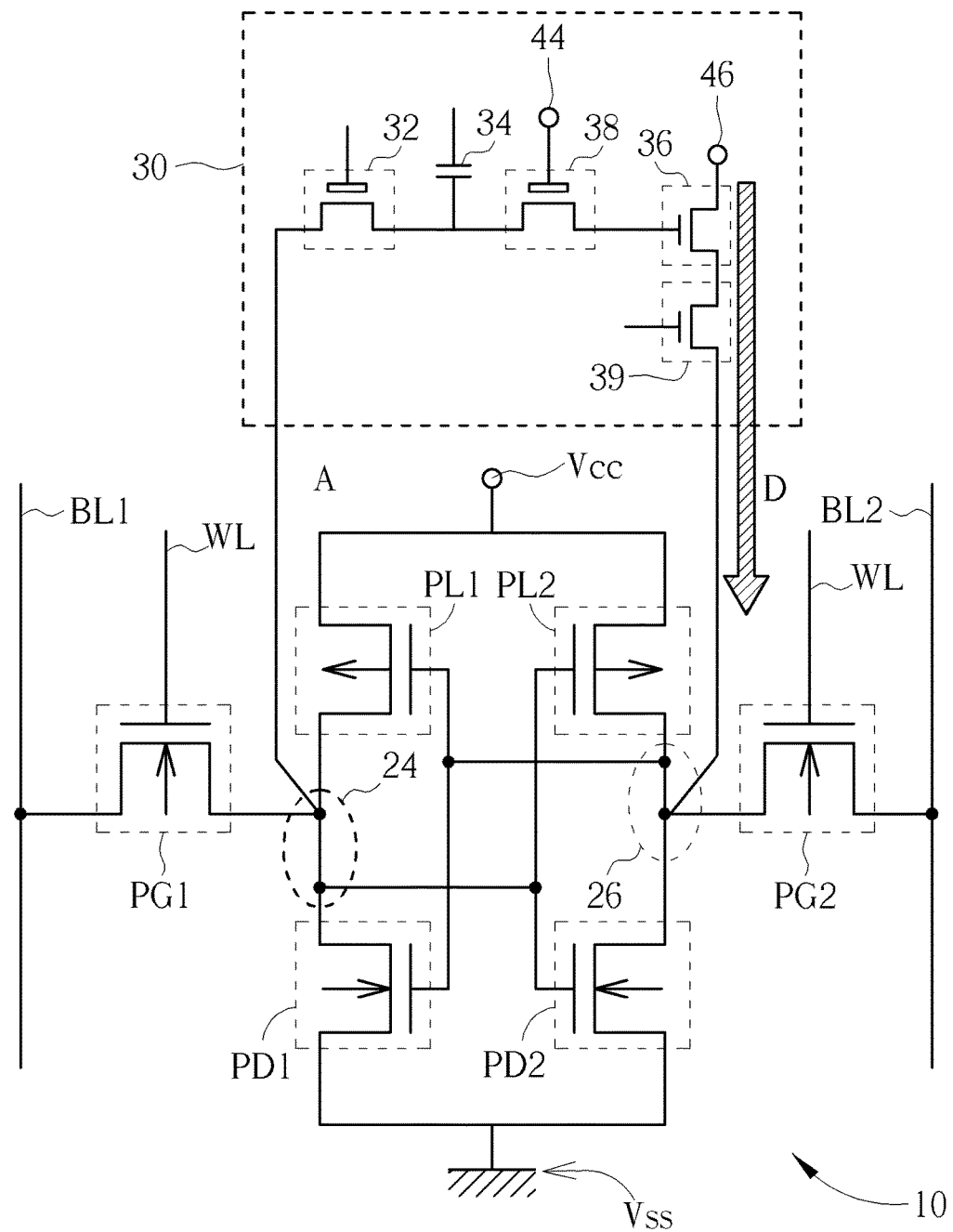
FIG. 5 illustrates a circuit diagram of a six-transistor SRAM (6T-SRAM) cell which is electrically connected to a dynamic oxide semiconductor random access memory (DOSRAM) according to a third preferred embodiment of the present invention.

In the third embodiment of the present invention, as shown in FIG. 5, compared with the second embodiment mentioned above, the feature of this embodiment further comprises a transistor 39 disposed between the second storage node 26 and the gate of the gain cell transistor 36. In the present invention, both the gain cell transistor 36 and the transistor 39 may be NMOS transistors or PMOS transistors, here takes NMOS transistors as an example. Besides, in this embodiment, the source of the gain cell transistor 36 is electrically connected to a voltage source $V_{DD}$ 46 or grounded, rather than electrically connected to a restore signal. The purpose of forming the transistor 39 is to connect or to disconnect the current path D (from the voltage source $V_{DD}$ to the second storage node 26). More precisely, the gate of the transistor 39 is electrically connected to a restore signal 44 too, when both the channel of the transistor 39 and the OSFET 38 are opened, current can flow from the voltage source $V_{DD}$ 46 to the second storage node 26. However, if the channel of the transistor 39 is closed, even though the channel of the OSFET 38 is opened, the current can still not be transferred to the second storage node 26. In other words, the current flow to the second storage node 26 can be controlled by the transistor 39. In this embodiment, the source of the gain cell transistor 36 has no need to be electrically connected to a restore signal. It should also be within the scope of the present invention.

Figure 6:
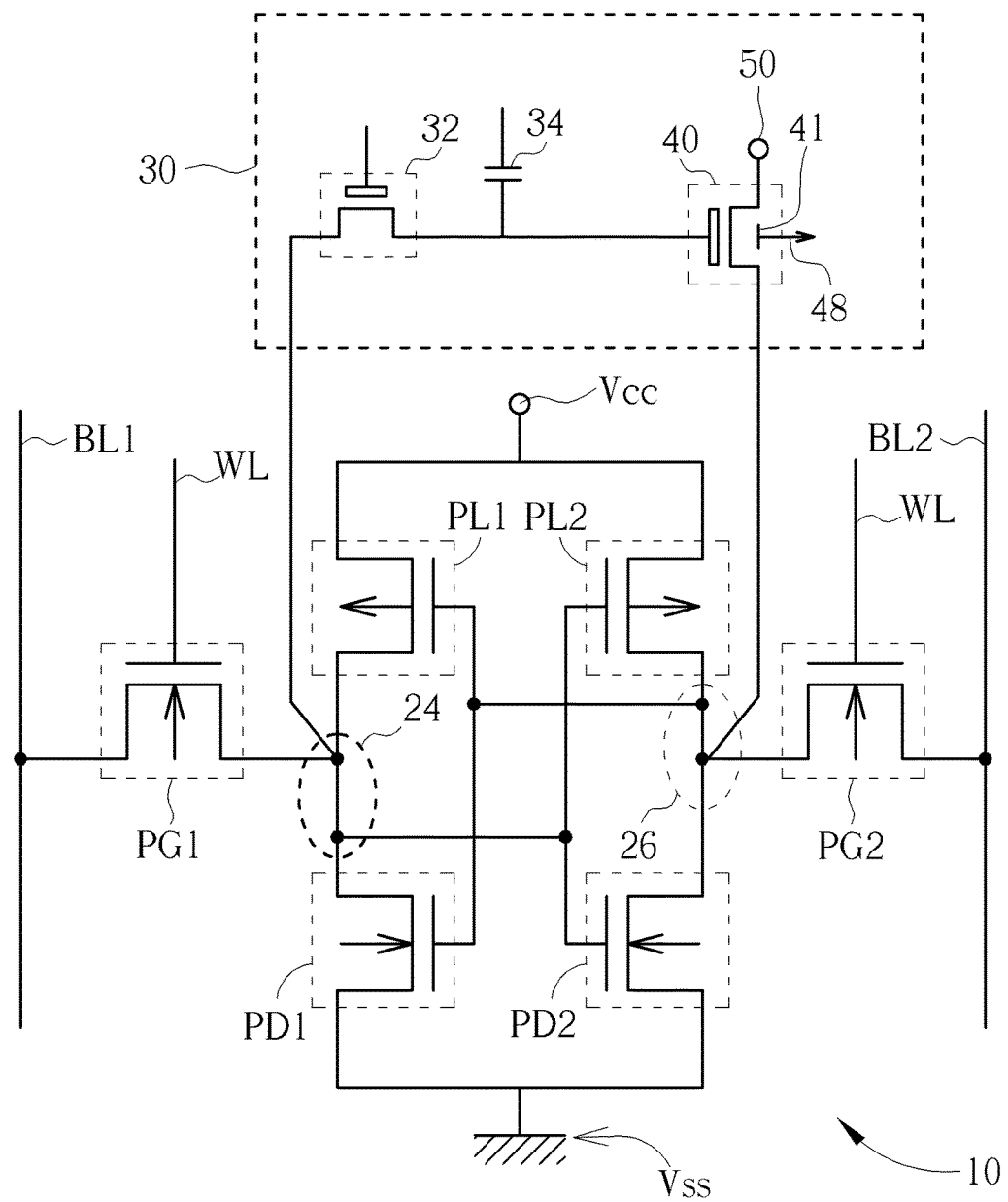
FIG. 6 illustrates a circuit diagram of a six-transistor SRAM (6T-SRAM) cell which is electrically connected to a dynamic oxide semiconductor random access memory (DOSRAM) according to a fourth preferred embodiment of the present invention.

In the fourth embodiment of the present invention, as shown in FIG. 6, compared with the first embodiment mentioned above, the feature of this embodiment is the gain cell transistor 36 is changed from a MOSFET (in the first preferred embodiment, the gain cell transistor 36 is a MOSFET) to become an OSFET 40. The OSFET has a top gate (not shown) and a back gate 41, and the back gate 41 of the OSFET 40 is electrically connected to a restore signal 48, to determine whether the channel of the OSFET 40 is opened or closed. Besides, the source of the OSFET 40 can be electrically to a voltage source $V_{DD}$ 50 or grounded. In this embodiment, by controlling the back gate 41 of the OSFET 40, the channel of the OSFET 40 can be closed. Since the leakage current of the OSFET 40 is very low, the leakage current from the capacitor 34 (mentioned in the second embodiment) can be cut off by the OSFET 40. In this way, the OSFET 38 mentioned in the second embodiment can be omitted and has no need to be formed. It should also be within the scope of the present invention.

In summary, the present invention provides a memory device which includes a SRAM connecting to a DOSRAM, and the data that is stored in the SRAM can be transferred into the DOSRAM. Afterwards, the SRAM can be turned off, thereby the power consumption of the memory device can be effectively reduced. By the applicant's experiment, after connecting the SRAM with a DOSRAM, the standby power of the memory device can be reduced from 2.9 µW to 0.003 µW. Besides, in order to cut off the leakage current from the capacitor while reading data from the DOSRAM, in some embodiments of the present invention, an additional OSFET is set between the capacitor and the gain cell transistor, thereby improving the accuracy of the memory device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory circuit, comprising:
   a static random access memory (SRAM), having a first storage node and a second storage node, wherein the SRAM comprises a first N-channel MOS transistor and a second N-channel MOS transistor, and the first N-channel MOS transistor and the second N-channel MOS transistor are electrically connected to a first voltage source (Vss); and
   a dynamic oxide semiconductor random access memory (DOSRAM), electrically connected to the SRAM, wherein the DOSRAM comprises:
      a first oxide semiconductor field effect transistor (OSFET) and a capacitor, wherein a source of the first OSFET is electrically connected to the first storage node, and a drain of the first OSFET is electrically connected to the capacitor; and
      a second oxide semiconductor field effect transistor (OSFET), wherein a gate of the second OSFET is electrically connected to the capacitor, and a drain of the second OSFET is electrically connected to the second storage node, and wherein a source of the second OSFET is electrically connected to a second voltage source, a potential of the second voltage source is higher than a potential of the first voltage source (Vss).

2. The semiconductor memory circuit of claim 1, wherein the SRAM comprises a 6T-SRAM.

3. The semiconductor memory circuit of claim 1, wherein the first OSFET and the second OSFET comprise an oxide semiconductor layer, and the oxide semiconductor layer comprises an indium gallium zinc oxide (IGZO) layer.

4. The semiconductor memory circuit of claim 1, further comprising a first bit line, a second bit line and a word line, wherein the SRAM comprises a first inverter including the first N-channel MOS transistor and a first P-channel MOS transistor, a second inverter including the second N-channel MOS transistor and a second P-channel MOS transistor with an input terminal of said second inverter being coupled to an output terminal of said first inverter and with an output terminal of said second inverter being coupled to an input terminal of said first inverter, a third N-channel MOS transistor having a source/drain path coupled between the output terminal of said first inverter and the first bit line, a first storage node defined between the source of the third N-channel MOS transistor and the output terminal of said first inverter, a fourth N-channel MOS transistor having a source/drain path coupled between the output terminal of said second inverter and the second bit line, and a gate of each of said third and fourth N-channel MOS transistors being connected to the word line.

5. The semiconductor memory circuit of claim 1, wherein the second OSFET has a top gate and a back gate.

6. The semiconductor memory circuit of claim 5, wherein a restore signal is electrically connected to the back gate of the second OSFET, to determine whether the second OSFET is activated or be deactivated.

\* \* \* \* \*